US012603251B2

(12) United States Patent
Kim et al.

(10) Patent No.: US 12,603,251 B2
(45) Date of Patent: Apr. 14, 2026

(54) HYBRID CHAMBER

(71) Applicant: TES CO., LTD, Yongin-si (KR)

(72) Inventors: Jae-Woo Kim, Seongnam-si (KR);
Sang-Woo Cho, Suwon-si (KR)

(73) Assignee: TES CO., LTD, Yongin-si (KR)

( * ) Notice: Subject to any disclaimer, the term of this
patent is extended or adjusted under 35
U.S.C. 154(b) by 489 days.

(21) Appl. No.: 18/130,429

(22) Filed: Apr. 4, 2023

(65) Prior Publication Data

US 2023/0326723 A1     Oct. 12, 2023

(30) Foreign Application Priority Data

Apr. 8, 2022    (KR) ........................ 10-2022-0044195
Mar. 13, 2023    (KR) ........................ 10-2023-0032690

(51) Int. Cl.
H01J 37/32          (2006.01)
(52) U.S. Cl.
CPC .... H01J 37/3244 (2013.01); H01J 37/32082
(2013.01); H01J 37/32522 (2013.01); *H01J*
*2237/024* (2013.01); *H01J 2237/334*
(2013.01); *H01J 2237/335* (2013.01)
(58) Field of Classification Search
USPC ...................................................... 118/724
See application file for complete search history.

(56) References Cited

U.S. PATENT DOCUMENTS

| | | | | |
|---|---|---|---|---|
| 5,574,247 | A | * | 11/1996 | Nishitani ................ C23C 16/54 |
| | | | | 118/712 |
| 6,594,446 | B2 | * | 7/2003 | Camm ................... H01L 21/324 |
| | | | | 219/390 |
| 2003/0097987 | A1 | * | 5/2003 | Fukuda ............. H01J 37/32082 |
| | | | | 156/345.35 |
| 2003/0207033 | A1 | * | 11/2003 | Yim .................... H01J 37/3244 |
| | | | | 427/255.394 |
| 2004/0067052 | A1 | * | 4/2004 | Goodman ......... H01L 21/67115 |
| | | | | 392/411 |
| 2021/0151300 | A1 | * | 5/2021 | Jung .................. H01J 37/32724 |
| 2021/0287877 | A1 | * | 9/2021 | Kim .................. H01J 37/32422 |
| 2023/0298859 | A1 | * | 9/2023 | Bravo .............. H01J 37/32357 |
| | | | | 156/345.27 |
| 2024/0210163 | A1 | * | 6/2024 | Wong .................... C23C 14/547 |

FOREIGN PATENT DOCUMENTS

| | | | | |
|---|---|---|---|---|
| JP | 2002-009141 A | | 1/2002 | |
| JP | 2002009141 | * | 1/2002 | ............ H01L 21/68 |
| KR | 10-2003-0038076 A | | 5/2003 | |
| KR | 10-2020-0013916 A | | 2/2020 | |
| KR | 2020013916 | * | 2/2020 | |
| KR | 10-2021-0115861 A | | 9/2021 | |

* cited by examiner

*Primary Examiner* — Ram N Kackar
(74) *Attorney, Agent, or Firm* — Park, Kim & Suh, LLC

(57)          ABSTRACT
The present invention relates to a hybrid chamber, and more
specifically, to a hybrid chamber capable of performing both
a gas phase etching (GPE) process for removing oxide from
a substrate and a radical dry cleaning (RDC) process for
removing nitride from the substrate in one chamber.

12 Claims, 9 Drawing Sheets

HYBRID CHAMBER

BACKGROUND OF THE INVENTION

Cross Reference to Related Application of the Invention

The present application claims the benefit of Korean Patent Applications No. 10-2022-0044195 filed in the Korean Intellectual Property Office on Apr. 8, 2022 and No. 10-2023-0032690 filed in the Korean Intellectual Property Office on Mar. 13, 2023 the entire contents of which are incorporated herein by reference.

Field of the Invention

The present invention relates to a hybrid chamber, and more specifically, to a hybrid chamber capable of performing both a gas phase etching (GPE) process for removing oxide from a substrate and a radical dry cleaning (RDC) process for removing nitride from the substrate in one chamber.

Background Art

According to a conventional art, oxide etching and nitride etching were respectively performed by separate apparatuses.

In other words, in the case of oxide etching, it is performed by a gas phase etching (GPE) method that supplies, for example, $NH_3$ and HF toward a substrate to perform etching, and heats by-products using a lamp or the like to remove the by-products.

Moreover, in the case of nitride etching, it is performed by a radical dry cleaning (RDC) method that provides plasma using fluorine-based gas, such as $CH_2F_2$, $CF_4$, $NF_3$, and the like to perform etching, and removes by-products using plasma.

At last, the conventional art is inconvenient in that the apparatus for oxide etching and the apparatus for nitride etching must be separately provided. Accordingly, the conventional art has several disadvantages in that there is an economic burden to purchase such apparatuses, and in that it is necessary to secure a space for installing the apparatuses and to operate multiple apparatuses.

SUMMARY OF THE INVENTION

Accordingly, the present invention has been made to solve the above-mentioned problems occurring in the prior arts, and it is an object of the present invention to provide a hybrid chamber capable of performing both a gas phase etching (GPE) method and a radical dry cleaning (RDC) method.

To accomplish the above object, according to the present invention, there is provided a hybrid chamber including: a chamber unit providing a processing space for a substrate; a gas supply unit provided in an upper portion of the chamber unit to supply at least one of process gas and plasma toward the substrate; and a lamp unit provided in the chamber unit to heat the substrate, wherein the gas supply unit includes: a gas inflow device into which at least two process gases are introduced; a first showerhead for dispersing the process gases below the gas inflow device; and a second showerhead provided to be vertically spaced apart from the first showerhead to form a plasma space between the first showerhead and the second showerhead, and supplying at least one of the process gases and plasma toward the substrate.

Here, an RF power source is connected to any one of the first showerhead and the second showerhead, and the other one is grounded.

Moreover, the hybrid chamber further includes a side gas supply line formed in the chamber unit and connected to the second showerhead.

Furthermore, the second showerhead includes: a through hole for supplying at least one of process gas and plasma provided in the plasma space; and a supply hole for supplying process gas supplied through the side gas supply line.

Meanwhile, the hybrid chamber may be configured to adjust the volume of the plasma space.

For instance, the hybrid chamber may further include an isolator provided at the edge of the plasma space to limit the plasma space.

Additionally, a relative distance between the first showerhead and the second showerhead is adjusted to adjust the volume of the plasma space.

In this case, the first showerhead is provided to be to be able to go up and down with respect to the second showerhead.

In addition, the chamber unit includes a chamber body providing the processing space and a heat exchange plate connected to the top of the chamber body, and the first showerhead is connected to the heat exchange plate. The hybrid chamber may further includes: lifting modules for vertically moving the heat exchange plate; and a variable insulating member provided under the heat exchange plate to insulate the first showerhead from the second showerhead and being capable of vertically extending and contracting.

Meanwhile, the lamp unit is disposed in at least one of the processing space and the chamber unit.

In a case in which the lamp unit is provided in the chamber unit, the lamp unit comprises: a recess formed in the chamber unit; a lamp disposed inside the recess; and a transparent portion blocking the recess from the processing space inside the chamber unit.

Moreover, the chamber unit includes a chamber body providing the processing space and a heat exchange plate connected to the top of the chamber body. The chamber body includes a first chamber body having a susceptor which is disposed in the first chamber body and on which the substrate is seated, and a second chamber body detachably connected to the top of the first chamber body, and the lamp unit is disposed on an upper portion of the first chamber body.

Furthermore, the lamp unit further includes a reflector, which is attached onto the inner wall of the recess or seals an upper portion of the recess to reflect heat of the lamp.

Additionally, at least one lamp unit is provided to traverse the processing space between the gas supply unit and the susceptor.

In this case, the lamp unit includes a tube traversing the processing space and having both ends connected to sidewalls of the chamber unit, and a lamp arranged inside the tube.

In addition, the chamber unit includes a chamber body providing the processing space and a heat exchange plate connected to the top of the chamber body. The chamber body includes a first chamber body having a susceptor which is disposed in the first chamber body and on which the substrate is seated, a second chamber body detachably connected to the first chamber body and having the lamp unit, and a third chamber body detachably connected to the second chamber body and having the first showerhead.

The hybrid chamber according to the present invention can reduce the installation space, reduce the burden of equipment operation, and further reduce the economic burden by performing both the gas phase etching (GPE) method and the radical dry cleaning (RDC) method.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 7 is a side sectional view of the hybrid chamber viewed from a different direction in a plane in FIG. 6;

FIG. 8 is a view illustrating a state in which a plasma space is relatively narrowed while a first showerhead descends downward in the embodiment of FIG. 6;

FIG. 9 is a side view illustrating a state in which a first chamber body, a second chamber body, and a third chamber body are rotated around each hinge shaft in the embodiment of FIG. 6.

DETAILED DESCRIPTION OF THE PREFERRED EMBODIMENT

Hereinafter, a structure of a hybrid chamber 1000 according to an embodiment of the present invention will be described in detail with reference to the drawings.

Figure 1:
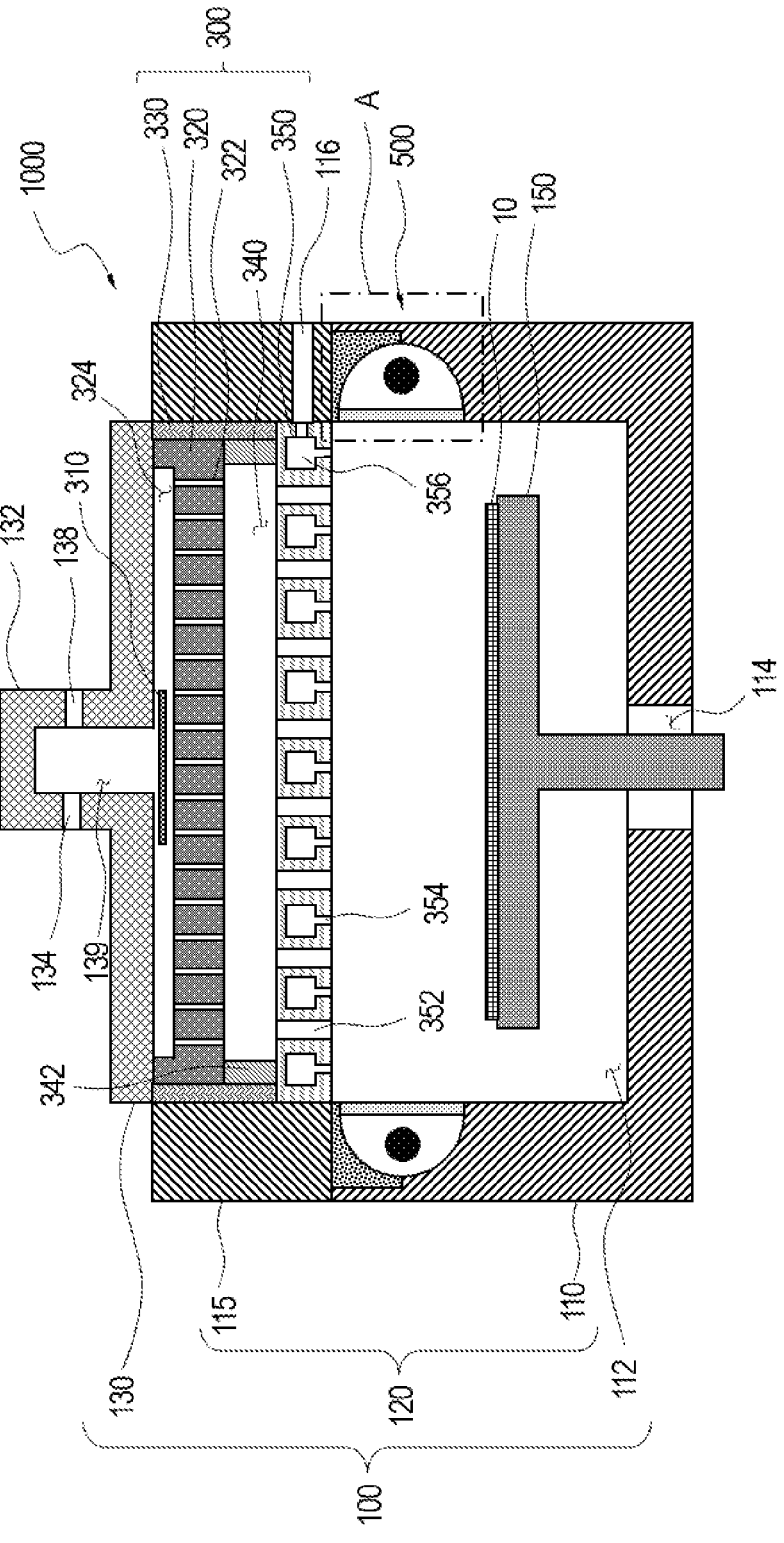
FIG. 1 is a side sectional view of a hybrid chamber according to a a first embodiment of the present invention.

FIG. 1 is a side sectional view of a hybrid chamber 1000 according to a first embodiment of the present invention.

Referring to FIG. 1, the hybrid chamber 1000 includes: a chamber unit 100 providing a processing space 112 for a substrate 10; a gas supply unit 300 provided in an upper portion of the chamber unit 100 to supply at least one of process gas and plasma toward the substrate 10; and a lamp unit 500 provided in the chamber unit 100 to heat the substrate 10.

According to the conventional art, oxide etching and nitride etching were respectively performed by separate apparatuses.

In other words, in the case of oxide etching, it is performed by a gas phase etching (GPE) method that supplies, for example, $NH_3$ and HF toward a substrate to perform etching, and heats by-products using a lamp or the like to remove the by-products.

Moreover, in the case of nitride etching, it is performed by a radical dry cleaning (RDC) method that provides plasma using fluorine-based gas, such as $CH_2F_2$, $CF_4$, $NF_3$, and the like to perform etching, and removes by-products using plasma.

At last, the conventional art is inconvenient in that the apparatus for oxide etching and the apparatus for nitride etching must be separately provided. Accordingly, the conventional art has several disadvantages in that there is an economic burden to purchase such apparatuses, and in that it is necessary to secure a space for installing the apparatuses and to operate multiple apparatuses.

In order to solve the above-mentioned problems occurring in the prior arts, it is an object of the present invention to provide a hybrid chamber capable of performing both a gas phase etching (GPE) method and a radical dry cleaning (RDC) method. The hybrid chamber according to the present invention can reduce the installation space, reduce the burden of equipment operation, and further reduce the economic burden by performing both the gas phase etching (GPE) method and the radical dry cleaning (RDC) method.

Hereinafter, referring to the drawings, the hybrid chamber 1000 will be described in more detail.

As illustrated in FIG. 1, the chamber unit 100 provides the processing space 112 for the substrate 10 inside. The chamber unit 100 may include a chamber body 120 and a heat exchange plate 130. The upper portion of the chamber body 120 may be opened to provide the aforementioned processing space 112 therein. The chamber body 120 may include a first chamber body 110 and a second chamber body 115. The heat exchange plate 130 may be connected to the open upper portion of the chamber body 120.

The first chamber body 110 is located at a lower portion, and a susceptor 150 on which the substrate 10 is seated may be provided inside the first chamber body 110. The susceptor 150 extends downward through an opening 114 formed in a base of the first chamber body 110 and may be installed to be able to go up and down.

The second chamber body 115 may be connected to the top of the first chamber body 110 to be detachable. The gas supply unit 300 which will be described later may be connected to the second chamber body 115, and the heat exchange plate 130 is connected to the top of the second chamber body 115. Therefore, if it is necessary to maintain the gas supply unit 300, the second chamber body 115 is separated from the first chamber body 110 so as to maintain easily.

Furthermore, the gas supply unit 300 is connected to the bottom of the heat exchange plate 130, so as to heat or cool the gas supply unit 300. For example, although not illustrated in the drawing, a flow path through which a heat exchange fluid flows is formed along the inside of the heat exchange plate 130 so that the gas supply unit 300 can be heated or cooled by the heat exchange fluid.

Meanwhile, the gas supply unit 300 may be provided on the inner upper portion of the chamber unit 100, and for example, may be connected to the second chamber body 115.

The gas supply unit 300 supplies at least one of process gas and plasma toward the processing space 112 or the substrate 10 to perform a processing process such as etching on the substrate 10 and remove by-products.

Specifically, the gas supply unit 300 includes: a gas inflow device 132 into which at least two process gases are introduced; a first showerhead 320 serving as a first electrode below the gas inflow device 132 to disperse the process gases; a plasma space 340 provided below the first showerhead 320; and a second showerhead 350 provided at the bottom of the plasma space 340 to serve as a second electrode.

The gas inflow device 132 may be provided at the uppermost portion of the gas supply unit 300 to introduce two or more process gases. However, the position of the gas inflow device 132 is just described as an example and may be appropriately modified.

In this embodiment, the gas inflow device 132 may be provided on the heat exchange plate 130 described above. For example, the gas inflow device 132 may be formed to protrude from the heat exchange plate 130. The gas inflow device 132 may be formed integrally with the heat exchange plate 130, or may be formed and connected as a separate member.

In this instance, the gas inflow device 132 may include at least two inlets 134 and 138 through which process gas flows. In a case in which there are two gas inlets 134 and 138, the first inlet 134 and the second inlet 138 may be provided at positions facing each other in the gas inflow device 132. Different kinds of process gases or the same process gas may be supplied through the first inlet 134 and the second inlet 138. The gas inflow device 132 may have a flow space 139 formed therein so that the process gas moves downward.

The first showerhead 320 may be provided below the gas inflow device 132, and may have a plurality of distribution holes 322. Meanwhile, a space between the first Showerhead 320 and the heat exchange plate 130 may be a dispersion space 324.

In this case, a baffle 310 may be provided in the distribution space 324. For instance, the baffle 310 may be disposed below the flow space 139 in the distribution space 324. Thus, the process gas moving downward along the flow space 139 may be radially dispersed by the baffle 310 in a plane.

In other words, the gas supplied through the gas inflow device 132 may move downward along the flow space 139, and may be dispersed in the dispersion space 324 by the baffle 310 to be supplied downward through the dispersion hole 322.

Meanwhile, the plasma space 340 may be provided below the first showerhead 320. The first showerhead 320 and the second showerhead 350 are vertically spaced apart from each other, and a space between the first showerhead 320 and the second showerhead 350 corresponds to the plasma space 340 where plasma is generated.

In this case, an RF power source may be connected to any one of the first showerhead 320 and the second showerhead 350, and the other one of the first showerhead 320 and the second showerhead 350 may be grounded. For example, the RF power source is connected to the first showerhead 320, and the second showerhead 350 may serve as a ground electrode. Alternatively, the first showerhead 320 may be grounded, and the RF power source may be connected to the second showerhead 350.

In a case in which the RF power source is connected to the first showerhead 320, an insulator 330 may be provided on the rim of the first showerhead 320. The insulator may prevent electricity from flowing between the first showerhead 320 and the second showerhead 350.

Meanwhile, an isolator 342 may be provided at the edge of the plasma space 340. The isolator 342 may limit the plasma space 340 to control the density of plasma and control the volume of the plasma space 340.

The height, width, and volume of the isolator 342 may be appropriately adjusted according to the process for the substrate 10, so the plasma density may be adjusted by adjusting the volume of the plasma space 340.

Meanwhile, the second showerhead 350 may be provided at the bottom of the plasma space 340. The second showerhead 350 supplies process gas or plasma formed in the plasma space 340 to the substrate 10 or the processing space 112.

In this instance, the chamber unit 100 may further include a side gas supply line 116 connected to the second showerhead 350. For example, The side gas supply line 116 may be connected to the second showerhead 350 through the side wall of the chamber body 120 or the heat exchange plate 130. The side gas supply line 116 directly supplies gas to the second showerhead 350 to supply the gas toward the substrate 10.

Among the gas combinations supplied for the processing process of the substrate 10, there may be a gas combination that generates by-products when gases react with each other. In a case in which these by-products are generated in the gas supply line or the like, it makes the internal passage of the gas supply line narrower, and in severe cases, the internal passage may be blocked. Thus, in the case of the gas combinations in which by-products are generated as described above, gases may be dispersed and supplied through the gas inflow device 132 and the side gas supply line 116.

For instance, in a case in which oxide etching is performed by the gas phase etching (GPE) method, $NH_3$ and HF are supplied toward the substrate. In this case, since by-products are generated when $NH_3$ and HF meet and react, it is necessary to slow down the reaction between $NH_3$ and HF as much as possible. Thus, $NH_3$ may be supplied through the gas inflow device 132, and HF may be supplied through the side gas supply line 116. In this case, $NH_3$ and HF meet in the processing space 112, so that the reaction between $NH_3$ and HF can be delayed as much as possible.

Meanwhile, the second showerhead 350 includes: a through hole 352 for supplying at least one of process gas and plasma provided in the plasma space 340; and a supply hole 354 for supplying process gas supplied through the side gas supply line 116.

The through hole 352 is formed through the second showerhead 350, and connects the plasma space 340 and the processing space 112 with each other. Accordingly, at least one of the process gas and the plasma provided through plasma space 340 may be supplied to the processing space 112 through the through hole 352.

Meanwhile, an inner space 356 communicating with the side gas supply line 116 may be formed inside the second showerhead 350, and a supply hole 354 is formed at the bottom of the inner space 356. The supply hole 354 connects the inner space 356 and the processing space 112 with each other. Therefore, the process gas supplied through the side gas supply line 116 may be supplied to the processing space 112 through the inner space 356 and the supply hole 354 of the second showerhead 350.

Meanwhile, The hybrid chamber 1000 may further include a lamp unit 500. The lamp unit 500 provides heat toward the substrate 10 to serve to remove by-products generated during the processing of the substrate 10.

The lamp unit 500 may be provided in any one among the processing space 112 and the chamber unit 100. Hereinafter, the lamp unit 500 is provided in the chamber unit 100, and it will be described assuming that the lamp unit 500 is provided in the chamber body 120 of the chamber unit 100.

Figure 2:
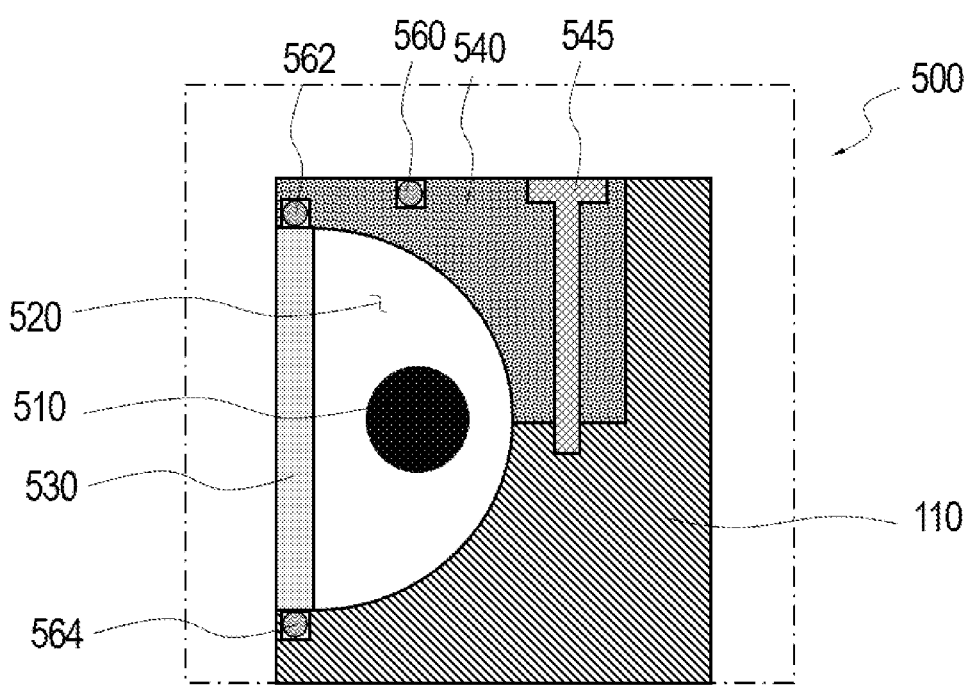
FIG. 2 is an enlarged partial cross-sectional view of a lamp unit in FIG. 1.

FIG. 2 is an enlarged partial cross-sectional view of an area 'A' in FIG. 1, and illustrates the configuration of the lamp unit 500.

Referring to FIGS. 1 and 2, The lamp unit 500 is provided on the chamber body 120, and for example, may be provided in the first chamber body 110.

In this case, the lamp unit 500 may be provided on an upper portion of the side wall of the first chamber body 110. in other words, the lamp unit 500 is provided on the upper portion of the first chamber body 110, and the second chamber body 115 may be connected to the upper portion of the lamp unit 500.

In a case in which it is necessary to maintain the lamp unit 500, when the second chamber body 115 is away from the first chamber body 110, the lamp unit 500 can be easily exposed to be maintained.

Specifically, the lamp unit 500 includes: a recess 520 formed in the chamber body 120; a lamp 510 disposed inside the recess 520; and a transparent portion 530 blocking the recess 520 from the processing space 112 inside the chamber unit 100.

The recess 520 is formed in the chamber body 120, and in this embodiment, the recess 520 is formed in the first chamber body 110. In this case, the recess 520 may be formed adjacent to the upper portion of the side wall of the first chamber body 110.

For example, the susceptor 150 on which the substrate 10 is seated ascends during the process on the substrate 10 to reach a process position (or process height). In this case, the recess 520 may be formed on the sidewall of the first chamber body 110 to correspond to the process position (or process height) of the susceptor 150.

Meanwhile, the lamp 510 providing heat may be arranged inside the recess 520. The lamp 510 may be arranged along the sidewall of the first chamber body 110 inside the recess 520.

The lamp 510 may be generally formed in a circular or semi-circular shape, but is not limited thereto, and may be modified according to the shape of the chamber body 120. In addition, the lamp 510 may provide heat by receiving electric power from an external power source (not shown). One or more lamps 510 may be provided. In a case in which plural lamps 510 are provided, it is also possible to control temperature by varying the temperature for each lamp.

Meanwhile, the recess 520 may be blocked and sealed from the processing space 112 by the transparent portion 530. The transparent portion 530 may be made of, for example, sapphire. Sealing portions 562 and 564 may be disposed at the top and the bottom of the transparent portion 530.

In a case in which the lamp 510 is arranged inside the recess 520, an inner wall of the recess 520 may be coated with a material that reflects heat. Accordingly, the heat of the lamp 510 may be effectively reflected and provided to the processing space 112.

Furthermore, the lamp unit 500 may further include a reflector 540. The reflector 540 is attached to the inner wall of the recess 520, or may be arranged to seal the upper portion of the recess 520 as illustrated in FIG. 2. Meanwhile, an angle at which the heat of the lamp 510 is reflected may be adjusted by adjusting an angle of the inner wall of the reflector 540. Such angle adjustment of the reflector 540 may be determined according to the process for the substrate 10.

Meanwhile, the reflector 540 may be detachably connected to the side wall of the first chamber body 120, and for example, may be connected by a fastening member 545 such as a bolt. The second chamber body 115 may be connected to the upper portion of the reflector 540, and a sealing part 560 may be provided on the upper surface of the reflector 540.

As described above, in the state in which the reflector 540 is detachably arranged, in a case in which it is necessary to maintain the lamp 510 arranged in the recess 520, the reflector 540 is separated to open the internal space of the recess 520. So, maintenance of the lamp 510 can be performed easily.

Figure 3:
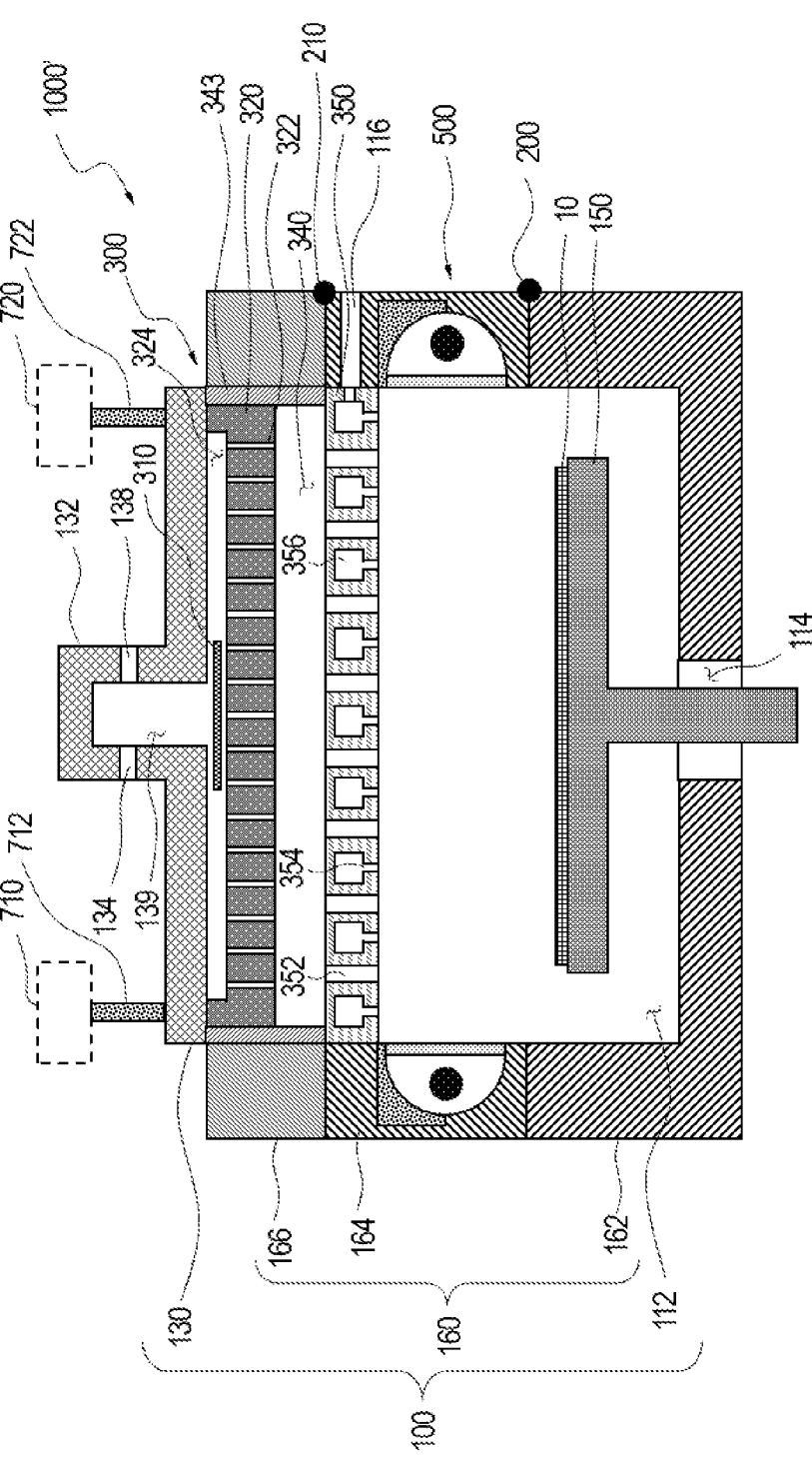
FIG. 3 is a side sectional view of a hybrid chamber according to a second embodiment of the present invention.

Meanwhile, FIG. 3 is a side cross-sectional view illustrating a hybrid chamber 1000' according to a second embodiment of the present invention.

Referring to FIG. 3, the hybrid chamber 1000' according to the second embodiment of the present invention may be configured to adjust the volume of the plasma space 340.

That is, while the process for the substrate 10 is being carried out using the hybrid chamber 1000, required plasma density may be varied according to the process. In this case, the hybrid chamber 1000' according to the present embodiment may adjust a relative distance between the first showerhead 320 and the second showerhead 350 to adjust the plasma density, thereby adjusting the volume of the plasma space 340.

For example, In the case of the hybrid chamber 1000' according to the second embodiment, the first showerhead 320 may be provided to ascend and descend with respect to the second showerhead 350.

Figure 4:
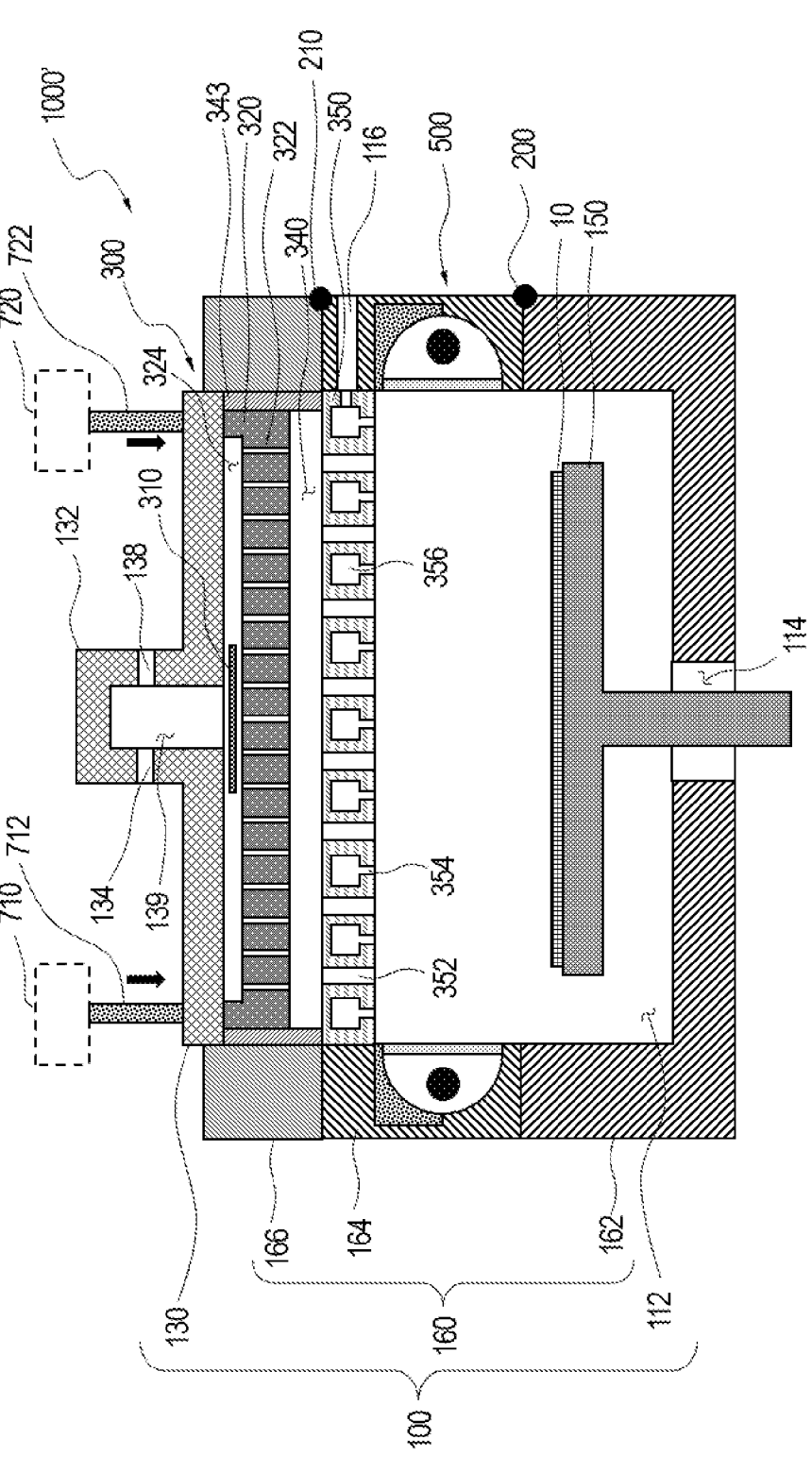
FIG. 4 is a view illustrating a state in which a plasma space is relatively narrowed while a first showerhead descends downward in the embodiment of FIG. 3.

FIG. 4 is a view illustrating a state in which the plasma space 340 is relatively narrowed while the first showerhead 320 descends downward in the state of FIG. 3.

Referring to FIGS. 3 and 4, the first showerhead 320 may be connected to the heat exchange plate 130. In other words, the first showerhead 320 may be connected to the lower portion of the heat exchange plate 130.

In this case, the hybrid chamber may further include: lifting modules 710 and 720 for vertically moving the heat exchange plate 130; and a variable insulating member 343 provided under the heat exchange plate 130 to insulate the first showerhead 320 from the second showerhead 350 and being capable of vertically extending and contracting.

The lifting modules 710 and 720 may be disposed, for example, above the heat exchange plate 130, and connected to the heat exchange plate 130 through driving bars 712 and 722. The lifting modules 710 and 720 may include a driving source such as a motor. When t driving bars 712 and 722 are pushed or pulled by operation of the driving source, it can adjust the height of the heat exchange plate, so as to adjust a distance between the first showerhead 320 and the second showerhead 350. Meanwhile, although not illustrated in the drawings, the lifting modules 710 and 720 may be arranged to support weight of the heat exchange plate 130 and the first showerhead 320 by a support structure.

In addition, the variable insulating member 343 may be provided under the heat exchange plate 130. The variable insulating member 343 may be connected to the lower portion of the heat exchange plate 130 along the rim of the first showerhead 320. In this case, the variable insulating member 343 may be manufactured to be vertically stretchable and contractible, and for example, the variable insulating member 343 may be provided in the form of bellows.

The variable insulating member 343 is stretched and contracted according to the distance between the first showerhead 320 and the second showerhead 350 in a case in which the height of the first showerhead 320 is varied so as to insulate the first showerhead 320 from the second showerhead 350.

Meanwhile, in the hybrid chamber 1000' according to the second embodiment of the present invention, the chamber unit 100 includes a chamber body 160 providing the processing space 112 and a heat exchange plate 130 connected to the top of the chamber body 160.

In this case, the chamber body 160 may have two or more bodies capable of being separated from each other in order to smoothly perform maintenance of various components inside the chamber body 160.

For instance, the chamber body 160 includes: a first chamber body 162 provided with a susceptor 150, on which the substrate 10 is seated, therein; a second chamber body 164 detachably connected to the first chamber body 162 and equipped with the lamp unit 500; a third chamber body 166 detachably connected to the second chamber body 164 and equipped with the first showerhead 320.

The number of the chamber bodies that can be spaced apart from each other is just one example, and may be less or more than three.

Meanwhile, in a case in which the heat exchange plate 130 is provided in the third chamber body 166, as described above, the heat exchange plate 130 may be provided to be movable up and down by the lifting modules 710 and 720.

Furthermore, the second showerhead 350 may be provided with the second chamber body 164, and the first showerhead 320 may be provided in the third chamber body 166.

The first chamber body 162, the second chamber body 164, and the third chamber body 166 may be arranged to be spaced apart in the vertical direction, or may be arranged to be able rotate around hinge shafts 200 and 210 disposed at one side of the chamber body 160.

For instance, the first chamber body 162 and the second chamber body 164 are rotatably connected by the first hinge shaft 200, and the second chamber body 164 and the third chamber body 166 may be rotatably connected by the second hinge shaft 210.

Figure 5:
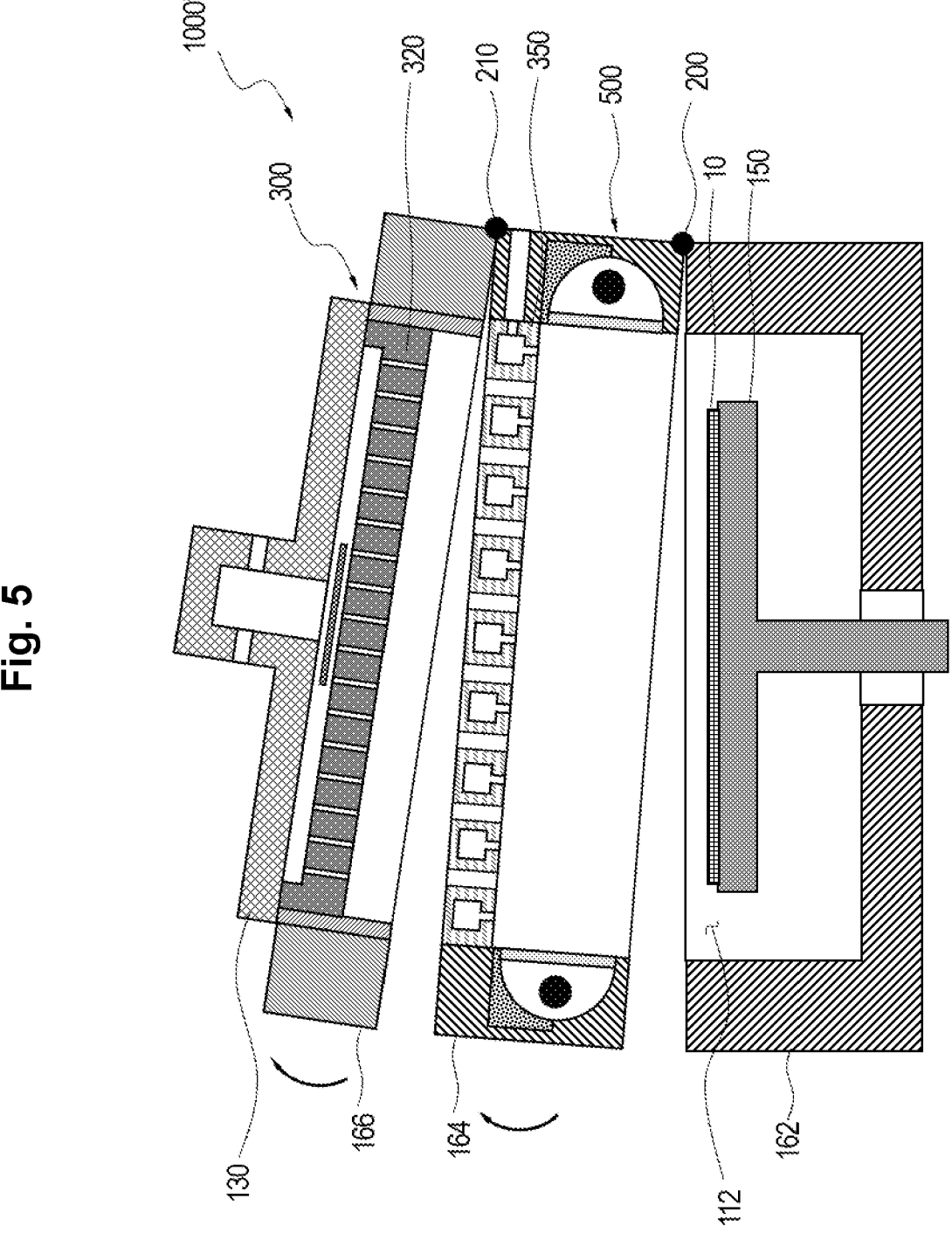
FIG. 5 is a side view illustrating a state in which a first chamber body, a second chamber body, and a third chamber body are rotated around each hinge shaft in the embodiment of FIG. 3.

FIG. 5 is a side view illustrating a state in which the first chamber body 162, the second chamber body 164, and the third chamber body 166 are rotated around each of the hinge shafts 200 and 210. In FIG. 5, the lifting modules 710 and 720 are omitted for convenience of illustration.

Referring to FIG. 5, the second chamber body 164 may rotate with respect to the first chamber body 162 around the first hinge shaft 200. As a result, the processing space 112 in the first chamber body 162 is opened so that accessibility to the susceptor 150 and the lamp unit 500 can be improved.

Additionally, the third chamber body 166 may rotate with respect to the second chamber body 164 around the second hinge shaft 210. Accordingly, accessibility to the first showerhead 320 and the second showerhead 350 is improved, so that workers and the likes can easily perform maintenance.

Figure 6:
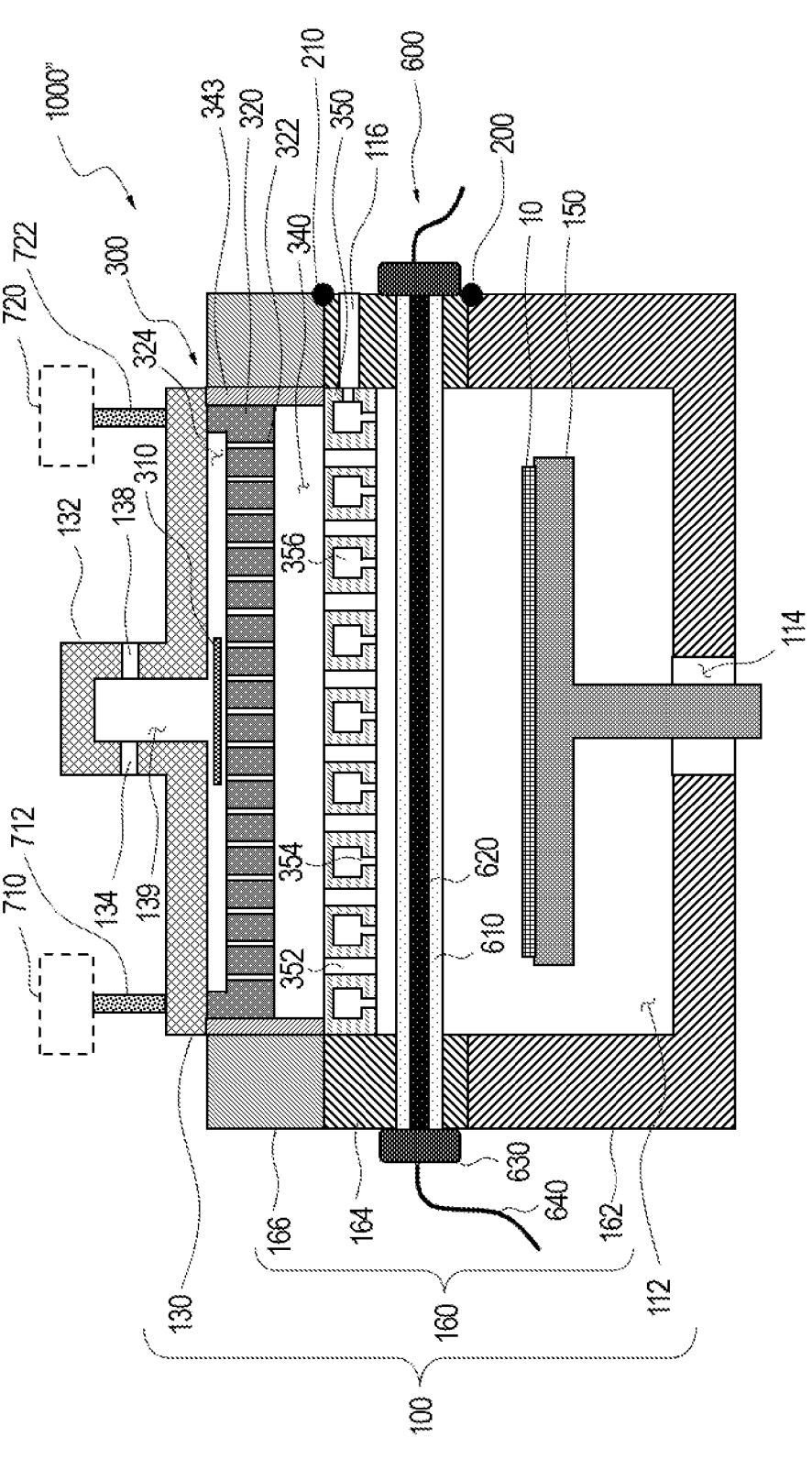
FIG. 6 is a side sectional view of a hybrid chamber according to a third embodiment of the present invention.
Figure 7:
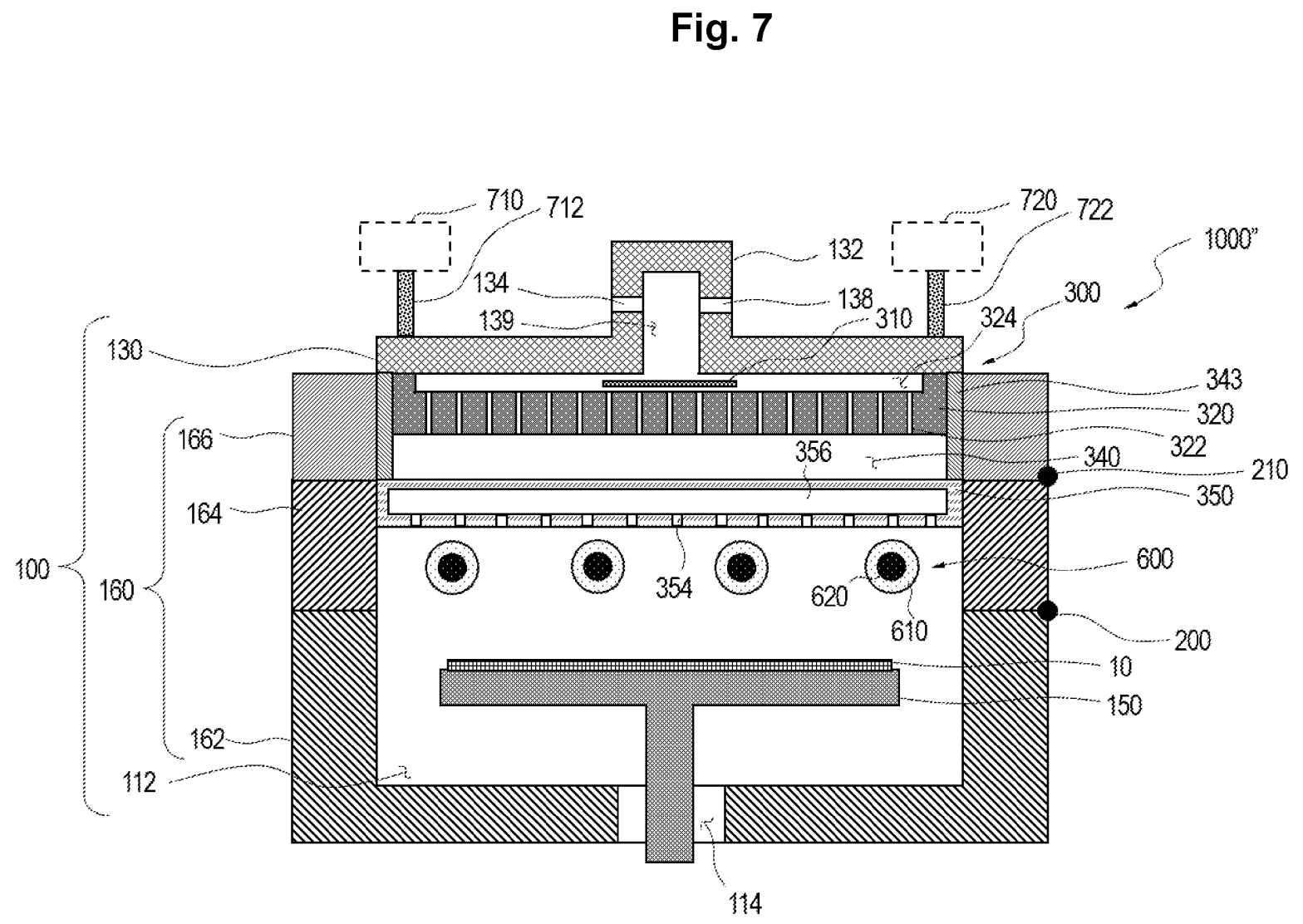

Meanwhile, FIG. 6 is a side sectional view of a hybrid chamber 1000" according to a third embodiment of the present invention, and FIG. 7 is a side sectional view of the hybrid chamber viewed from a different direction in a plane in FIG. 6.

For instance, FIG. 7 is a side cross-sectional view of the hybrid chamber viewed from another direction rotated 90 degrees on a plane of FIG. 6. In FIGS. 6 and 7, the same reference numerals are used for the same components as those in the above-described embodiments.

Referring to FIGS. 6 and 7, in the hybrid chamber 1000", at least one lamp unit 600 may be provided across the processing space 112 between the gas supply unit 300 and the susceptor 150.

in other words, in the case of the hybrid chamber 1000" according to the third embodiment of the present invention, the lamp unit 600 is not inserted into the recess 520 but may be arranged across the processing space 112 above the substrate 10. Accordingly, the heat emitted from the lamp unit 600 can heat the substrate 10 more effectively. The lamp units 600 may be arranged above the substrate 10 to be spaced apart from each other at a predetermined interval.

Specifically, the lamp unit 600 includes: a tube 610 traversing the processing space 112 and having both ends connected to sidewalls of the chamber unit 100; and a lamp 620 arranged inside the tube 610.

The tube 610 may be made of a material capable of emitting heat radiated from the lamp 620 provided therein, and both ends of the tube 610 may be connected to the sidewalls of the chamber unit 100.

For example, through holes may be formed in the sidewalls of the chamber unit 100, and both ends of the tube 610 may be inserted and connected to the through holes.

The lamp 620 may be disposed inside the tube 610. Heat emitted from the lamp 620 may be radiated through the tube 610.

In this case, a reflective film may be coated on the surface or the inner surface of the tube 610 so that heat emitted from the lamp 620 is not directed toward the upper portion of the tube 610 but is directed toward the substrate 10 below the tube 610. For instance, the reflective film may be coated along the surface or the inner surface of the upper portion of the tube 610.

Meanwhile, connectors 630 may be connected to both ends of the tube 610. The connectors 630 may be connected to both ends of the tube 610 from the outside of the chamber unit 100. The connectors 630 are connected to both ends of the tube 610 to serve to seal between the tube 610 and the chamber unit 100. Furthermore, a power line 640 for providing electric power to the lamp 620 may be connected to the lamp 620 through the connector 630.

In this case, since temperature of the connector 630 may rise due to the power line 640, a cooling unit capable of cooling the connector 630 may be provided. The cooling unit may be realized by a fan unit installed adjacent to the connector 630, or may be realized by forming a cooling passage through which a heat exchange fluid flows inside the connector 630. In the present invention, a specific configuration of the cooling unit is not limited.

Meanwhile, like the hybrid chamber 1000' according to the second embodiment illustrated in FIGS. 3 and 4, the hybrid chamber 1000" according to the third embodiment also includes lifting modules 710 and 720 to adjust the volume of the plasma space 340.

Figure 8:
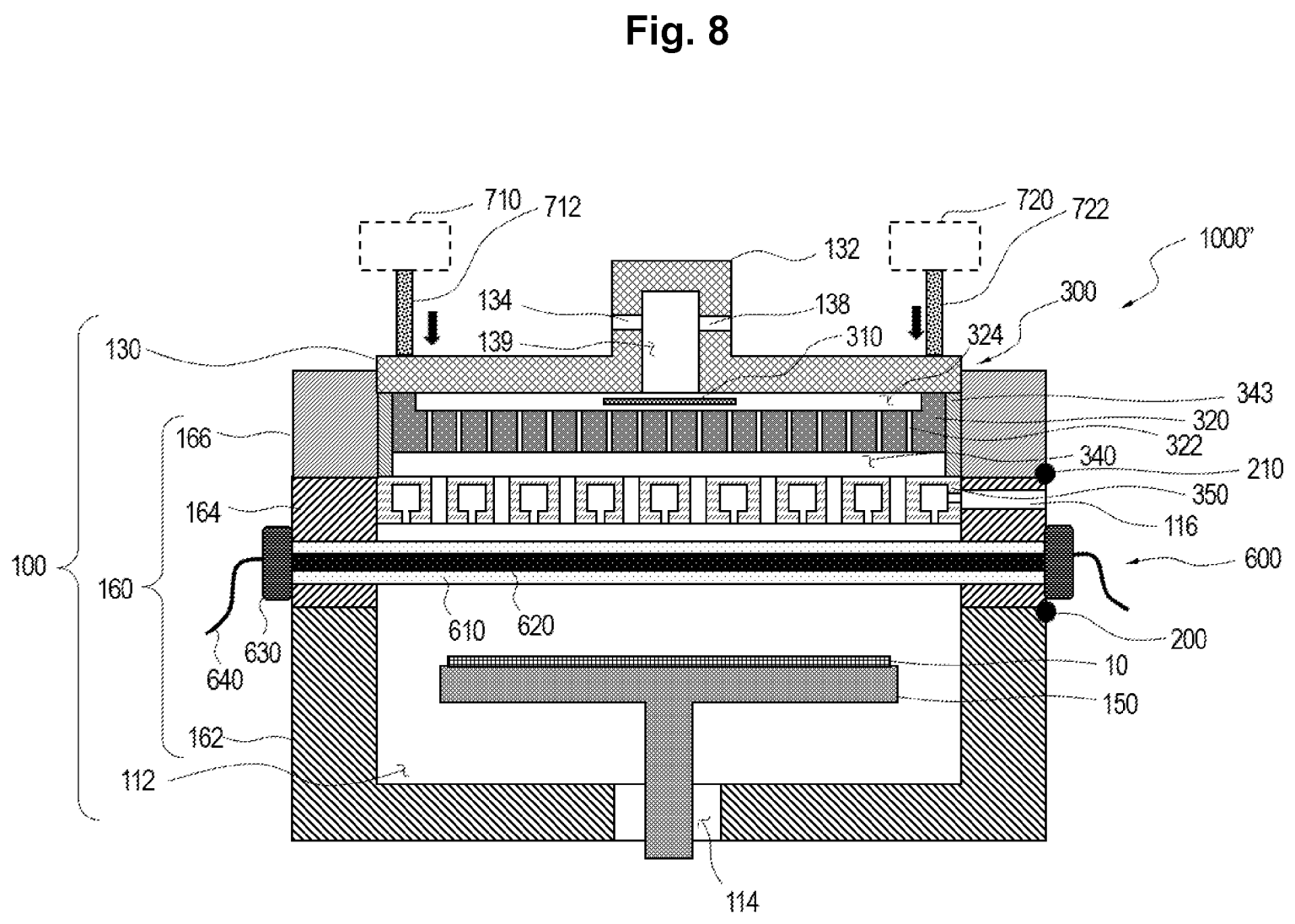

FIG. 8 is a view illustrating a state in which the plasma space 340 is relatively narrowed while the first showerhead 320 descends downward in the state of FIG. 6. Since the lifting modules 710 and 720 have the same configuration as those of the second embodiment, description thereof will be omitted.

Like the hybrid chamber 1000' according to the second embodiment illustrated in FIGS. 3 and 4, the hybrid chamber 1000" according to the third embodiment includes two or more chamber bodies capable of being spaced apart from each other.

Figure 9:
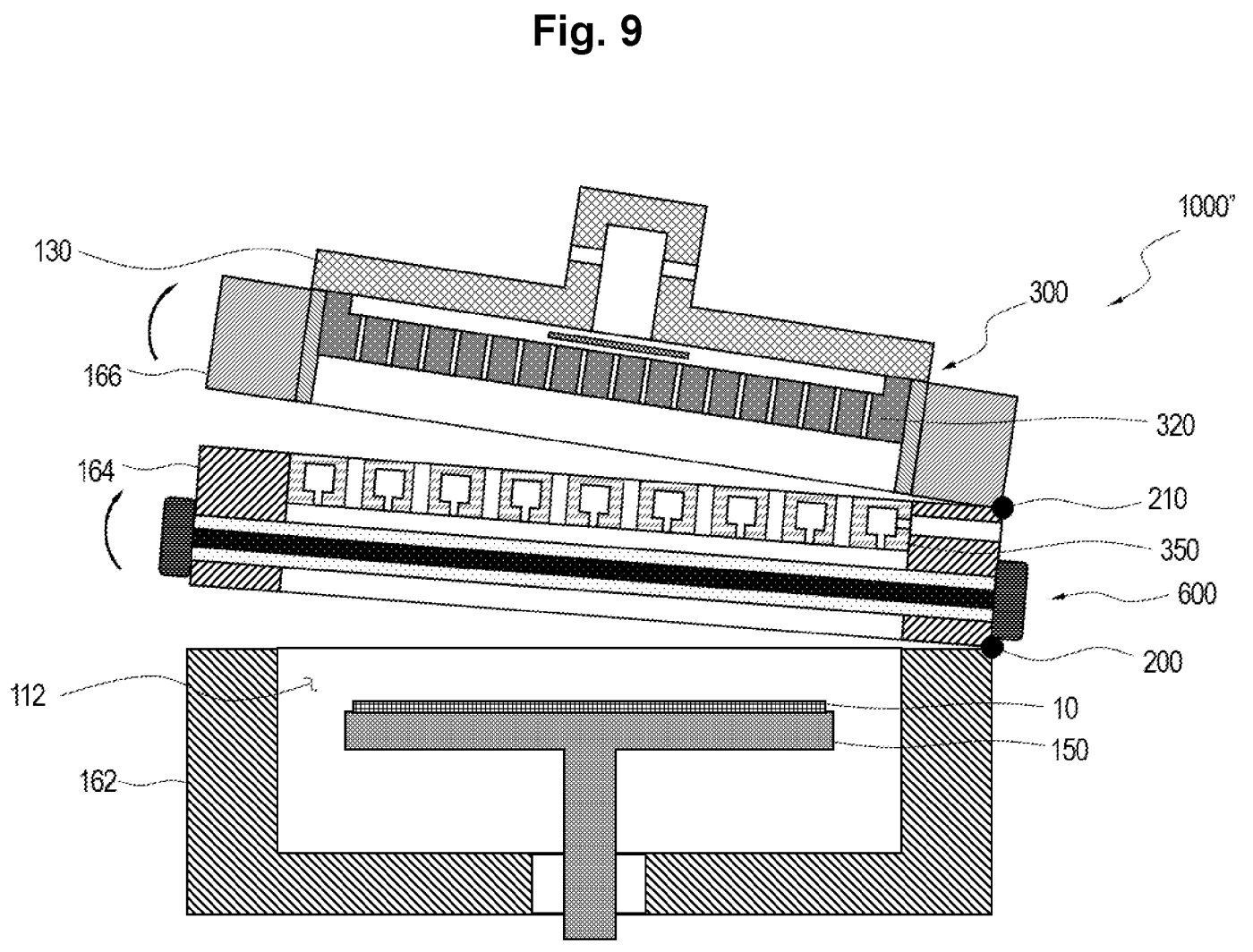

For example, the hybrid chamber 1000" according to the third embodiment includes a first chamber body 162, a second chamber body 164, and a third chamber body 166 connected by hinge shafts 200 and 210. FIG. 9 is a side view illustrating a state in which the first chamber body 162, the second chamber body 164, and the third chamber body 166 are rotated around the hinge shafts 200 and 210. Since the rotation structure is the same as that of the second embodiment, description thereof will be omitted.

Hereinafter, a substrate processing process using the hybrid chambers 1000, 1000', or 1000" having the above configuration will be described.

First, in order to remove oxide from the substrate 10, NH$_3$ together with bulk gas may be supplied through the first inlet 134 of the gas inflow device 132. Here, the bulk gas may be N$_2$, O$_2$, or Ar which is inert gas.

In addition, HF may be supplied through the side gas supply line 116. In this case, when NH$_3$ and HF meet and react, by-products are generated. Thus, when NH$_3$ is supplied through the gas inflow device 132 and HF is supplied through the side gas supply line 116, the reaction between NH$_3$ and HF can be delayed as much as possible.

When the oxide of the substrate 10 is removed, by-products may be generated. These by-products may be removed by using at least one among the lamp units 500 and 600 and plasma, or by alternately using the lamp units 500 and 600 and plasma.

Meanwhile, in order to remove nitride from the substrate 10, H$_2$ and florin-based gas, such as CH$_2$F$_2$, CF$_4$, and NF$_3$, may be supplied to the second inlet 138 of the gas inflow device 132, and gas such as O$_2$, N$_2$, or the like may be supplied through the first inlet 134. In this case, plasma is generated by using electrodes of the first showerhead 320 and the second showerhead 350 and is supplied to the substrate 10 to remove nitride from the substrate 10.

Meanwhile, even in this case, the by-products may be removed by using at least one among the lamp units 500 and 600 and plasma, or by alternately using the lamp units 500 and 600 and plasma.

In removal of oxide or nitride etching, when the by-products are removed by using plasma, plasma may be supplied by using the electrodes of the first showerhead 320 and the second showerhead 350 in the plasma space 340 by using N$_2$, O$_2$, H$_2$, Ar or the like among the above-mentioned bulk gases.

In a case in which the by-products are removed using only the lamp units 500 and 600, electric power is supplied to the lamps 510 and 620 of the lamp units 500 and 600 to uniformly heat the entire surface of the substrate 10.

In addition, in a case in which the by-products are removed using plasma and the lamp units 500 and 600 together, plasma is supplied to the central portion of the substrate 10 through the gas supply unit 300, and the lamp units 500 and 600 may be provided to heat the edge of the substrate 10.

Although the present invention has been described with reference to preferred embodiments, it will be understood by those of ordinary skill in the art that various modifications and equivalents may be made without deviating from the spirit or scope of the invention described in the claims described below. Therefore, if the modifications and equivalents basically include the components of the claims of the present invention, all of them should be considered to be included in the technical scope of the present invention.

What is claimed is:

1. A hybrid chamber comprising:
   a chamber unit providing a processing space for a substrate,
   wherein the chamber unit comprises:
   a first chamber body;
   a second chamber body rotatably coupled to the first chamber body; and
   a third chamber body rotatably coupled to the second chamber body;
   a heat exchange plate provided in an upper portion of the third chamber body;
   a gas supply unit provided in an upper portion of the third chamber body to supply at least one of process gas and plasma toward the substrate; and a lamp unit embedded in a sidewall of the second chamber body provided in the chamber unit to heat the substrate,
   wherein the gas supply unit comprises:
   a gas inflow device formed to protrude from the heat exchange plate into which at least two process gases are introduced through gas inlets facing each other;
   a first showerhead coupled to the third chamber body for dispersing the process gases below the gas inflow device; and
   a second showerhead coupled to an upper portion of the sidewall of the second chamber body to form a plasma space with the first showerhead and to supply at least one of the process gases and plasma toward the substrate,
   wherein the lamp unit comprises:
   a recess embedded in a lower portion of the sidewall of the second chamber body;
   a lamp disposed in the recess; and
   a transparent window blocking the recess from the processing space,
   wherein the transparent window is flushed with an inner surface of the sidewall of the second chamber body.

2. The hybrid chamber according to claim 1, wherein an RF power source is connected to any one of the first showerhead and the second showerhead, and the other one is grounded.

3. The hybrid chamber according to claim 1, further comprising:
   a side gas supply line formed in the upper portion of the sidewall of the second chamber body and connected to the second showerhead.

4. The hybrid chamber according to claim 3, wherein the second showerhead comprises:
   a through hole for supplying at least one of process gas and plasma provided in the plasma space; and
   a supply hole for supplying process gas supplied through the side gas supply line.

5. The hybrid chamber according to claim 1, wherein the volume of the plasma space is adjusted.

6. The hybrid chamber according to claim 1, further comprising:
   an isolator provided at the edge of the plasma space to limit the plasma space.

7. The hybrid chamber according to claim 1, wherein a relative distance between the first showerhead and the second showerhead is adjusted to adjust the volume of the plasma space.

8. The hybrid chamber according to claim 7, wherein the first showerhead is provided to be able to go up and down with respect to the second showerhead.

9. The hybrid chamber according to claim 8, wherein the chamber unit further comprises a heat exchange plate connected to a top of the third chamber body,
   wherein the first showerhead is connected to the heat exchange plate, and
   wherein the hybrid chamber further comprises:
   lifting modules for vertically moving the heat exchange plate; and
   a variable insulating member provided under the heat exchange plate to insulate the first showerhead from the second showerhead and being capable of vertically extending and contracting.

10. The hybrid chamber according to claim 1, wherein the chamber unit further comprises a heat exchange plate connected to a top of the third chamber body,
   wherein the first chamber body includes a susceptor on which the substrate is seated.

11. The hybrid chamber according to claim 1, wherein the lamp unit further includes a reflector, which is attached onto an inner wall of the recess or seals an upper portion of the recess to reflect heat of the lamp.

12. A hybrid chamber comprising:

a chamber unit providing a processing space for a substrate, wherein the chamber unit comprises:

a first chamber body;

a second chamber body rotatably coupled to the first chamber body; and a third chamber body rotatably coupled to the second chamber body;

a heat exchange plate provided in an upper portion of the third chamber body;

a gas supply unit provided in an upper portion of the third chamber body to supply at least one of process gas and plasma toward the substrate; and a lamp unit coupled to the second chamber body to heat the substrate, wherein the gas supply unit comprises:

a gas inflow device formed to protrude from the heat exchange plate into which at least two process gases are introduced through gas inlets facing each other;

a first showerhead coupled to the third chamber body for dispersing the process gases below the gas inflow device; and a second showerhead coupled to an upper portion of the second chamber body to form a plasma space with the first showerhead and to supply at least one of the process gases and plasma toward the substrate, wherein the lamp unit comprises:

a tube coupled to a lower portion of the second chamber body; and a lamp arranged inside of the tube.

\* \* \* \* \*